(12) United States Patent
Lin

(10) Patent No.: US 12,108,541 B2
(45) Date of Patent: Oct. 1, 2024

(54) WELDING STRUCTURE AND DISPLAY MODULE

(71) Applicant: GUANGZHOU GOVISIONOX TECHNOLOGY CO., LTD., Guangdong (CN)

(72) Inventor: Yangchun Lin, Langfang (CN)

(73) Assignee: GUANGZHOU GOVISIONOX TECHNOLOGY CO., LTD., Guangzhou (CN)

( * ) Notice: Subject to any disclaimer, the term of this patent is extended or adjusted under 35 U.S.C. 154(b) by 227 days.

(21) Appl. No.: 17/968,204

(22) Filed: Oct. 18, 2022

(65) Prior Publication Data

US 2023/0035388 A1     Feb. 2, 2023

Related U.S. Application Data

(63) Continuation of application No. PCT/CN2021/095396, filed on May 24, 2021.

(30) Foreign Application Priority Data

Aug. 27, 2020    (CN) .......................... 202010879549.8

(51) Int. Cl.
    *H05K 3/32*          (2006.01)
    *H05K 1/14*          (2006.01)

(52) U.S. Cl.
    CPC ............... *H05K 3/328* (2013.01); *H05K 1/14* (2013.01); *H05K 2203/04* (2013.01)

(58) Field of Classification Search
    CPC ....... H05K 3/328; H05K 1/14; H05K 2203/04
    See application file for complete search history.

(56) References Cited

U.S. PATENT DOCUMENTS

| | | | | |
|---|---|---|---|---|
| 2003/0094305 | A1* | 5/2003 | Ueda ...................... | H05K 3/361 174/254 |
| 2005/0183884 | A1* | 8/2005 | Su ......................... | H05K 3/361 174/257 |

(Continued)

FOREIGN PATENT DOCUMENTS

| | | |
|---|---|---|
| CN | 201374870 Y | 12/2009 |
| CN | 101636037 A | 1/2010 |

(Continued)

OTHER PUBLICATIONS

First Office Action issued on May 6, 2021 in corresponding Chinese Application No. 202010879549.8; 17 pages.

(Continued)

*Primary Examiner* — Sherman Ng
(74) *Attorney, Agent, or Firm* — Maier & Maier, PLLC

(57) ABSTRACT

A welding structure and a display module. The welding structure includes: an output carrier, arranged with a first welding area on a side edge of the output carrier; an input carrier. A first end of the input carrier is arranged with a second welding area, the second welding area being electrically connected to the first welding area; an orthographic projection of the first end of the input carrier on the output carrier is disposed beyond the first welding area; and at least one set of a first support member and a second support member. The first support member is disposed on the input carrier and at a position of the first end beyond the first welding area; the second support member is disposed on the output carrier and opposite to the first support member.

20 Claims, 2 Drawing Sheets

(56) References Cited

U.S. PATENT DOCUMENTS

2005/0194678 A1 9/2005 Chuang
2013/0314883 A1* 11/2013 Ling ................. H05K 7/026
                                                    361/749
2020/0010740 A1* 1/2020 Lee .................. H01L 24/13

FOREIGN PATENT DOCUMENTS

| CN | 206061289 U | 3/2017 |
| CN | 110062524 A | 7/2019 |
| CN | 110286535 A | 9/2019 |
| CN | 110335548 A | 10/2019 |
| CN | 110391039 A | 10/2019 |
| CN | 110687728 A | 1/2020 |
| CN | 210836897 U | 6/2020 |
| CN | 112135467 A | 12/2020 |
| JP | 2002103600 A | 4/2002 |

OTHER PUBLICATIONS

Second Office Action issued on May 6, 2021 in corresponding Chinese Application No. 202010879549.8; 14 pages.
International Search Report issued on Aug. 24, 2021 in corresponding International Application No. PCT/CN2021/095396; 14 pages.

* cited by examiner

WELDING STRUCTURE AND DISPLAY MODULE

CROSS REFERENCE TO RELATED APPLICATIONS

The present application is a continuation-application of International (PCT) Patent Application No. PCT/CN2021/095396, filed on May 24, 2021, which claims priority of Chinese Patent Application No. 202010879549.8, filed on Aug. 27, 2020, in the China National Intellectual Property Administration, the entire contents of which are hereby incorporated by reference in its entirety.

TECHNICAL FIELD

The present disclosure relates to the field of display technologies, and in particular to a welding structure and a display module.

BACKGROUND

A display module generally contains a screen body, a flexible printed circuit board, etc. The screen body and the flexible printed circuit board are usually connected electrically through a chip on film (COF).

Conventionally, during the welding process of the chip on film and the screen body, they will be pressed together through a pressure head. The screen body and/or the chip on film at an edge of a welding area will be prone to cracks during the press-fit process, and in serious cases the cracks may extend to lines in the display module, thereby causing poor display of the display module.

SUMMARY

A technical solution of the present disclosure is to provide a welding structure, including: an output carrier, arranged with a first welding area on a side edge of the output carrier; an input carrier; wherein a first end of the input carrier is arranged with a second welding area, the second welding area being electrically connected to the first welding area; an orthographic projection of the first end of the input carrier on the output carrier is disposed beyond the first welding area; and at least one set of a first support member and a second support member; wherein the first support member is disposed on the input carrier and at a position of the first end beyond the first welding area; the second support member is disposed on the output carrier and opposite to the first support member.

Another technical solution of the present disclosure is to provide a display module including the welding structure in any of the above embodiments.

DETAILED DESCRIPTION

The following will be a clear and complete description of the technical solutions in the embodiments of the present disclosure in conjunction with the accompanying drawings in the embodiments of the present disclosure. Obviously, the described embodiments are only a part of the embodiments of the present disclosure, and not all of them. Based on the embodiments in the present disclosure, all other embodiments obtained by those skilled in the art without creative labor fall within the scope of the present disclosure.

Figure 1:
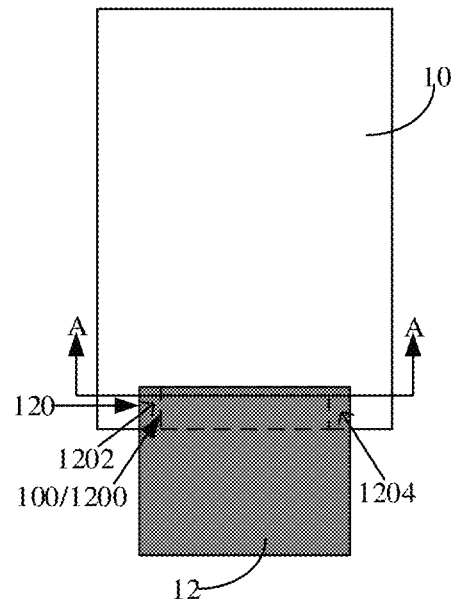
FIG. 1 is a structural schematic view of a welding structure according to an embodiment of the present disclosure.
Figure 2:
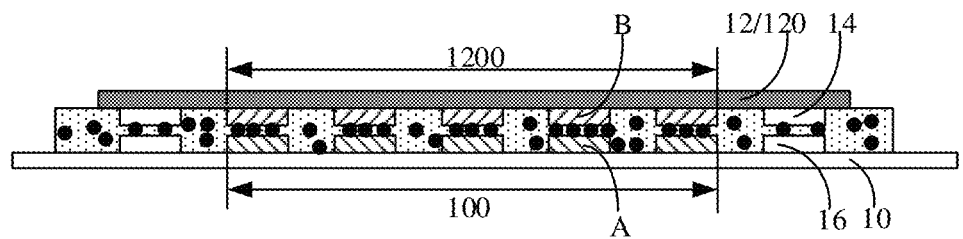
FIG. 2 is a schematic cross-sectional view at an A-A section line in FIG. 1.

Referring to FIGS. 1 and 2, the present disclosure provides a welding structure that may be applied to a flexible OLED display module, a Micro-OLED display module, etc., and also to a testing process of welding a flexible printed circuit board to an adapter board. The welding structure includes an output carrier 10, an input carrier 12, and at least one set of a first support member 14 and a second support member 16.

Specifically, when the welding structure applied to a display module, the output carrier 10 may be any one of a display, an adapter board, and a flexible printed circuit board. Taking the display as an example, the output carrier 10 may include a plurality of film layers stacked in sequence. For example, the output carrier 10 includes an array layer, a light-emitting layer, a packaging layer, a touch layer, etc. stacked in sequence. A side edge of the output carrier 10 is arranged with a first welding area 100. The first welding area 100 may be disposed on the array layer, and a signal line (for example, data line, scan line, etc.) in the array layer may be electrically connected to the first welding area 100. Alternatively, the first welding area 100 may be disposed on the touch layer, and a touch electrode (for example, the transmitter electrode, receiver electrode) in the touch layer may be electrically connected to the first welding area 100.

The input carrier 12 may be any one of a chip on film, a flexible printed circuit board, and an adapter board. A first end 120 of the input carrier 12 is arranged with a second welding area 1200 electrically connected to the first welding area 100, e.g., by conductive particles (e.g., anisotropic conductive film (ACF), etc.). An orthographic projection of the first end 120 of the input carrier 12 on the output carrier 10 is disposed beyond the first welding area 100. In this embodiment, it may be considered that the size of the second welding area 1200 is substantially the same as the size of the first welding area 100 at a corresponding position.

The first support member 14 and the second support member 16 are disposed between the output carrier 10 and the first end 120 of the input carrier 12. The first support member 14 is disposed on the input carrier 12 and is disposed at a position of the first end 120 beyond the first welding area 100. The second support member 16 is disposed on the output carrier 10 and is disposed opposite to the first support member 14.

In this embodiment, referring to FIG. 2, a surface of the first welding area 100 is arranged with a plurality of first connection lines A, and a surface of the second welding area 1200 is arranged with a plurality of second connection lines B. One of second connection lines B correspond to one of the first connection lines A and are electrically connected to each other, e.g., electrically connected by conductive particles, such that the output carrier 10 is electrically connected to the input carrier 12 through the first connection lines A and second connection lines B. The plurality of first connection lines A are spaced on the surface of the first welding area 100 and the plurality of second connection lines B are spaced on the surface of the second welding area 1200. Each first connection line A is conducted along a vertical direction and isolated from adjacent first connection lines A along a horizontal direction. Each second connection line B is conducted along the vertical direction and isolated from adjacent second connection lines B along the horizontal direction. In some embodiments, the material of the first support member 14 is the same as the material of the second connection lines B, and the material of the second support member 16 is the same as the material of the first connection lines A. By virtue of the above design method, the first support member 14 and the second connection line B may be prepared and formed at the same time, and the second support member 16 and the first connection line A may be prepared and formed at the same time, thereby reducing the complexity of the preparation process and improving efficiency.

In some embodiments, the thickness of the first support member 14 may be the same as the thickness of each second connection line B, and the thickness of the second support member 16 may be the same as the thickness of each first connection line A, thereby further reducing the complexity of the preparation process.

In some embodiments, the material of the second connection lines B and the first connection lines A is metal, and the first support member 14 and the second support member 16 are electrically floating metal wires. The electrical floating means that the second support member 16 is non-electrically connected to the first connection lines A on the output carrier 10, and the first support member 14 is non-electrically connected to the second connection lines B on the input carrier 12, and the first support member 14 and the second support member 16 do not create an electrical circuit therebetween. The first support member 14 and the second support member 16 made of metal have a high hardness and a low probability of cracking during the press-fit process.

In an actual preparation process, the first connection lines A and the second support member 16 may be formed simultaneously on a substrate of the output carrier 10 by patterning a metal layer, and the thickness of each formed first connection line A and the thickness of the second support member 16 may be the same. The second connection lines B and the first support member 14 may be formed simultaneously on a substrate of the input carrier 12 by patterning a metal layer, and the thickness of each formed second connection line B and the thickness of the first support member 14 may be the same. Of course, in other embodiments, non-simultaneous formation may be applied, where the thickness of each formed first connection line A and the thickness of the second support member 16 may be different, and the thickness of each second connection line B and the thickness of the first support member 14 may also be different.

Figure 3:
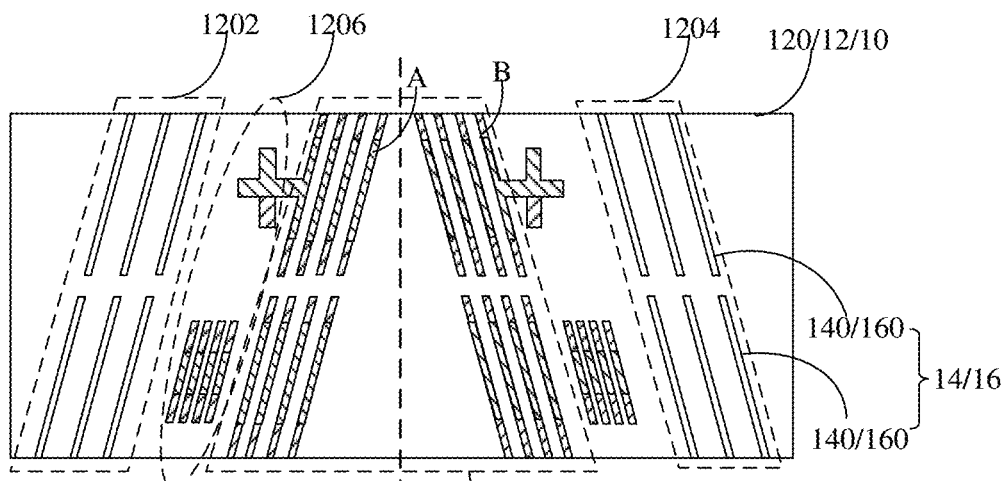
FIG. 3 is a schematic top view of welding of a second welding area of an input carrier to a first welding area of an output carrier in FIG. 1.

Referring to FIGS. 1 and 3 together, the first end 120 of the input carrier 12 includes a first portion 1202 and a second portion 1204 that are projected orthogonally on the output carrier 10 beyond the first welding area 100. The second welding area 1200 is arranged opposite to the first welding area 100. The first portion 1202 and the second portion 1204 are arranged symmetrically with respect to the second welding area 1200. Among them, a plurality of the first support members 14 are arranged in the first portion 1202 and the second portion 1204. Correspondingly, a plurality of the second support members 16 are arranged in positions of the output carrier 10 corresponding to the first portion 1202 and the second portion 1204. By virtue of this design, the input carrier 12 may play a protective effect on two distal ends of the first welding area 100, and reduce the probability of cracks in the output carrier 10 and input carrier 12 during the press-fit process.

In some embodiments, as shown in FIG. 3, the plurality of first support members 14 in the first portion 1202 are arranged parallel to each other and equally spaced, and the plurality of first support members 14 in the second portion 1204 are arranged parallel to each other and equally spaced, which can make the plurality of first support members 14 and the corresponding plurality of second support members 16 at the first portion 1202 and the second portion 1204 subjected to more balanced pressure, thereby reducing the probability of the first support 14 and the second support 16 breaking, and thus reducing the probability of cracks in the output carrier 10 and the input carrier 12. Of course, in other embodiments, only the plurality of first support members 14 in the first portion 1202 may be arranged parallel to each other and equally spaced; or, only the plurality of first support members 14 in the second portion 1204 may be arranged parallel to each other and equally spaced.

In some embodiments, as shown in FIG. 3, a first support member 14 is linear in shape and extends in the same direction as the extension of the adjacent second connection lines B, and corresponding second support member 16 is also linear in shape and extends in the same direction as the extension of the adjacent first connection lines A, which reduces the requirement for alignment accuracy between the input carrier 12 and the output carrier 10. For example, when a second connection line B in the input carrier 12 is slightly adjusted to the left or right of the first connection lines A in the output carrier 10, the above design may still enable the first support member 14 to correspond to the second support member 16 at a corresponding position.

In some embodiments, as shown in FIG. 3, the first end 120 of the input carrier 12 has a symmetry axis L perpendicular to a direction from the first portion 1202 to the second portion 1204, and the first support members 14 in the first portion 1202 extend in a different direction than the first support members 14 in the second portion 1204. For example, the first support members 14 in the first portion 1202 extend toward the lower left, while the first support members 14 in the second portion 1204 extend toward the lower right. The above design may improve a welding pulling force between the input carrier 12 and the output carrier 10. In addition, the above way of setting the symmetry axis L also indicates that the second connection lines B in the second welding area 1200 of the input carrier 12 are also symmetrically arranged about the symmetry axis L.

In addition, the second welding area 1200 of the input carrier 12 may further be arranged with a marking area 1206 between the second welding area 1200 and the first portion 1202 on a side thereof and another marking area 1206 between the second welding area 1200 and the second portion 1204 on another side thereof. The marking area 1206 may be arranged with a marking line designed in a specific pattern to serve as a positioning marking. For example, the marking line may be the cross-shaped marking line illustrated in FIG. 3.

As shown in FIG. 3, each first support member 14 is formed by at least two first support sub-members 140 disposed in a same line and spaced apart, and each second support member 16 is formed by at least two second support sub-members 1600 disposed in a same line and spaced apart. One first support sub-member 140 may correspond to at least one second support sub-member 160; alternatively, one second support sub-member 160 may correspond to at least one first support sub-member 140. During the pressure press-fit process, when cracks develop on the first support member 14 or the second support member 16, the above spaced design may block the crack propagation. Of course, in other embodiments, the first support member 14 may also be a linearly extending whole and the second support member 16 is formed by at least two second support sub-members 160 disposed in a same line and spaced apart; or, the second support member 16 is a linearly extending whole and the first support member 14 is formed by at least two first support sub-members 140 disposed in a same line and spaced apart.

Figure 4:
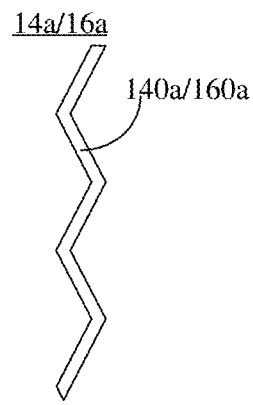
FIG. 4 is a structural schematic view of a first support member or a second support member in FIG. 3 according to another embodiment of the present disclosure.

Of course, in other embodiments, other methods may be applied to stop crack propagation. As shown in FIG. 4, which is a structural schematic view of the first support member or the second support member in FIG. 3 according to another embodiment, the first support member 14a includes a plurality of interconnected first support sub-members 140a, and the extension directions between adjacent first support sub-members 140a are different. For example, an angle between the extension directions of adjacent first support sub-members 140a is 30°, 60°, etc. Similarly, the second support member 16a may include a plurality of interconnected second support sub-members 160a, and the first support sub-members 140a correspond to the second support sub-members 160a one by one. The above design can make the crack-generating stress decompose between adjacent first support sub-members 140a or adjacent second support sub-members 160a, prevent the stress from propagating, and reduce the distance of crack propagation. It should be noted that the first support sub-member 140a and the second support sub-member 160a in FIG. 4 are each linear in shape. In other embodiments, the first support sub-member 140a and the second support sub-member 160a may be each arcuate. In FIG. 4, adjacent first support sub-members 140a are interconnected, and adjacent second support sub-members 160a are interconnected. In other embodiments, adjacent first support sub-members 140a may be spaced apart, and/or, adjacent second support sub-members 160a may also be spaced apart; specifically, the first support member 14a includes a plurality of first support sub-members 140a arranged at intervals with different extension directions between adjacent first support sub-members 140a, and the second support member 16a includes a plurality of second support sub-members 160a arranged at intervals with different extension directions between adjacent second support sub-members 160a, and the first support sub-members 140a correspond to the second support sub-members 160a one by one.

Figure 5:
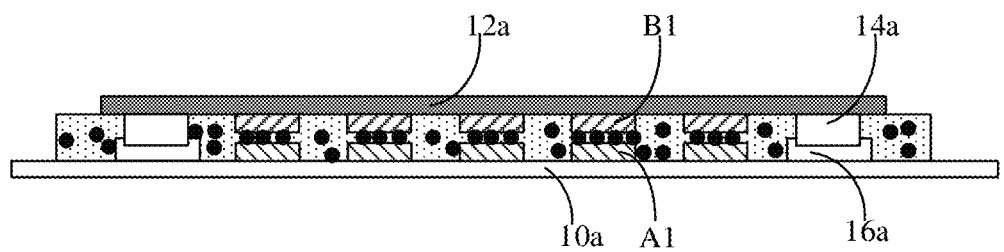
FIG. 5 is a schematic cross-sectional view at an A-A section line in FIG. 1 according to another embodiment of the present disclosure.

In yet other embodiments, as shown in FIG. 5, which shows a schematic cross-sectional view at an A-A section line in FIG. 1 according to another embodiment, the first support member 14a defines a non-through recess, and at least a portion of the second support member 16a opposite to the first support member 14a is disposed in the recess; or, the second support member 16a defines a non-through recess, and at least a portion of the first support member 14a opposite to the second support member 16a is disposed in the recess. For example, the second support member 16a in FIG. 5 is defines a recess, and the first support member 14a opposite thereto is disposed in the recess. In this case, a sum of the height of the first support member 14a and the height of the second support member 16a is greater than the sum of the height of the second connection line B1 and the height of the first connection line A1. In some embodiments, the first support member 14a in FIG. 5 has a regular rectangular cross-section on the A-A profile line. In other embodiments, the cross-section of the first support member 14a on the A-A profile line may be T-shaped, with the end of the T-shape being disposed in the recess. Of course, in other embodiments, a recess may be defined on the first support member 14a, with at least a portion of the second support member 16a disposed in the recess. The above design allows the position of the first support member 14a and the second support member 16a to be defined by the recess, further reducing the probability of displacement of the input carrier 12a and the output carrier 10a. It can be understood that a non-through recess is also called a blind recess, which is defined on a surface of an object and extends till an interior of the object, i.e., not through the object.

Figure 6:
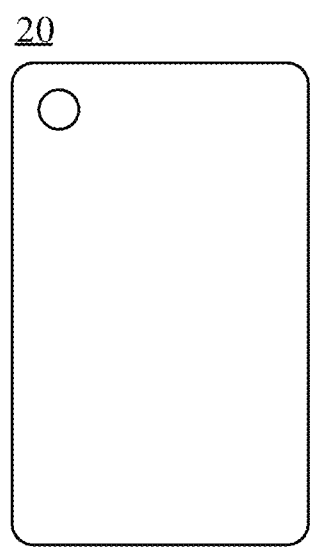
FIG. 6 is a structural schematic view of a display module according to an embodiment of the present disclosure.

Referring to FIG. 6, FIG. 6 is a structural schematic view of a display module according to an embodiment of the present disclosure. The display module 20 may include the welding structure in any of the above embodiments. For example, the above welding structure may be applied between the array layer and the chip on film or the flexible printed circuit board of the display module 20. For another example, the above welding structure may be applied between the touch layer and the flexible printed circuit board of the display module 20.

In the present disclosure, when the input carrier 12 is a display, a position where the first end 120 of the input carrier 12 is beyond the second welding area 1200 is in a headroom area of the welding structure. The headroom area of the input carrier 12 and the corresponding output carrier 10 is free of line design. That is, after the introduction of the first support member 14 and the second support member 16 in the headroom area, the surface contact of the first support member 14 and the second support member 16 may reduce the pressure exerted by the first support member 14 and the second support member 16 on the output carrier 10 and the input carrier 12 on both sides, which is equivalent to spreading the pressure on the first support member 14 and the second support member 16, thereby reducing the probability of cracks in the output carrier 10 and the input carrier 12 during the press-fit process. When the display module is adopted with the above welding structure, the probability of defective display may be reduced and the display effect may be improved.

The above is only an example of the present disclosure, not to limit the scope of the present disclosure. Any equivalent structure or equivalent process transformation using the specification and the accompanying drawings of the present disclosure, or directly or indirectly applied in other related technical fields, are included in the scope of the present disclosure.

What is claimed is:

1. A welding structure, comprising: an output carrier, arranged with a first welding area on a side edge thereof; an input carrier; wherein a first end of the input carrier is arranged with a second welding area, the second welding area is electrically connected to the first welding area, and an orthographic projection of the first end of the input carrier on the output carrier is disposed beyond the first welding area; and at least one set of a first support member and a second support member; wherein the first support member is disposed on the input carrier and at a position of the first end beyond the first welding area; the second support member is disposed on the output carrier and opposite to the first support member; wherein, a surface of the first welding area is arranged with a plurality of first connection lines, and a surface of the second welding area is arranged with a plurality of second connection lines; the plurality of first connection lines and the plurality of second connection lines correspond to each other one by one and are electrically connected to each other; a material of the first support member is the same as a material of the second connection lines; and wherein, a thickness of the first support member is the same as a thickness of each second connection line.

2. The welding structure according to claim 1, wherein, a surface of the first welding area is arranged with a plurality of first connection lines, and a surface of the second welding area is arranged with a plurality of second connection lines; the plurality of first connection lines and the plurality of second connection lines correspond to each other one by one and are electrically connected to each other; a material of the second support member is the same as a material of the first connection lines.

3. The welding structure according to claim 2, wherein, a thickness of the second support member is the same as a thickness of each first connection line.

4. The welding structure according to claim 1, wherein, the second welding area and the first welding area are electrically connected by conductive particles, and the first support member and the second support member are floating metal wires.

5. The welding structure according to claim 1, wherein, the first end of the input carrier comprises a first portion and a second portion, orthogonal projections of the first portion and the second portion on the output carrier is disposed beyond the first welding area; the second welding area is arranged opposite to the first welding area, and the first portion and the second portion are arranged symmetrically with respect to the second welding area; wherein a plurality of the first support members are arranged in the first portion and the second portion, and a plurality of the second support members are arranged in the output carrier corresponding to the first portion and the second portion.

6. The welding structure according to claim 5, wherein, the plurality of first support members in the first portion are arranged parallel to each other and equidistant from each other.

7. The welding structure according to claim 5, wherein, the plurality of first support members in the second portion are arranged parallel to each other and equidistant from each other.

8. The welding structure according to claim 1, wherein, the first support member is linear in shape, and an extension direction of the first support member is the same as an extension direction of one of the plurality of second connection lines adjacent to the first support member.

9. The welding structure according to claim 2, wherein, the second support member is linear in shape, and an extension direction of the second support member is the same as an extension direction of one of the plurality of first connection lines adjacent to the second support member.

10. The welding structure according to claim 8, wherein, the first support member comprises at least two first support sub-members disposed in a same line and spaced apart.

11. The welding structure according to claim 9, wherein, the second support member comprises at least two second support sub-members disposed in a same line and spaced apart.

12. The welding structure according to claim 5, wherein, the first end of the input carrier has a symmetry axis perpendicular to a direction from the first portion to the second portion, and an extension direction of the plurality of first support members in the first portion is different from an extension direction of the plurality of first support members in the second portion.

13. The welding structure according to claim 1, wherein, the first support member comprises a plurality of interconnected first support sub-members, and two neighboring first support sub-members have different extension directions; the second support member comprises a plurality of interconnected second support sub-members, and two neighboring second support sub-members have different extension directions; the plurality of interconnected first support sub-members and the plurality of interconnected second support sub-members correspond to each other one by one.

14. The welding structure according to claim 1, wherein, the first support member comprises a plurality of first support sub-members arranged at intervals, and two neighboring first support sub-members have different extension directions; the second support member comprises a plurality of second support sub-members arranged at intervals, and two neighboring second support sub-members have different extension directions; the plurality of first support sub-members and the plurality of second support sub-members correspond to each other one by one.

15. The welding structure according to claim 1, wherein, the first support member defines a blind recess, and at least a portion of the second support member opposite to the first support member is disposed in the blind recess; or the second support member defines a blind recess, and at least a portion of the first support member opposite to the second support member is disposed in the blind recess.

16. The welding structure according to claim 1, wherein the output carrier is any one of a display, an adapter board, and a flexible printed circuit board, and the input carrier is any one of a chip on film, a flexible printed circuit board, and an adapter board.

17. The welding structure according to claim 1, further comprising a plurality of marking areas disposed between the second welding area of the input carrier and the first portion on a side of the second welding area and between the second welding area of the input carrier and the second portion on the other side of the second welding area, wherein a plurality of marking lines are disposed in the marking areas.

18. A display module, comprising a welding structure according to claim 1.

19. A welding structure, comprising: an output carrier, arranged with a first welding area on a side edge thereof; an input carrier; wherein a first end of the input carrier is arranged with a second welding area, the second welding area is electrically connected to the first welding area, and an orthographic projection of the first end of the input carrier on the output carrier is disposed beyond the first welding area; and at least one set of a first support member and a second support member; wherein the first support member is disposed on the input carrier and at a position of the first end beyond the first welding area; the second support member is disposed on the output carrier and opposite to the first support member; wherein, a surface of the first welding area is arranged with a plurality of first connection lines, and a surface of the second welding area is arranged with a plurality of second connection lines; the plurality of first connection lines and the plurality of second connection lines correspond to each other one by one and are electrically connected to each other; a material of the second support member is the same as a material of the first connection lines; and wherein, a thickness of the second support member is the same as a thickness of each first connection line.

20. A welding structure, comprising: an output carrier, arranged with a first welding area on a side edge thereof; an input carrier; wherein a first end of the input carrier is arranged with a second welding area, the second welding area is electrically connected to the first welding area, and an orthographic projection of the first end of the input carrier on the output carrier is disposed beyond the first welding area; and at least one set of a first support member and a second support member; wherein the first support member is disposed on the input carrier and at a position of the first end beyond the first welding area; the second support member is disposed on the output carrier and opposite to the first support member; wherein, the first end of the input carrier comprises a first portion and a second portion, orthogonal projections of the first portion and the second portion on the output carrier is disposed beyond the first welding area; the second welding area is arranged opposite to the first welding area, and the first portion and the second portion are arranged symmetrically with respect to the second welding area; wherein a plurality of the first support members are arranged in the first portion and the second portion, and a plurality of the second support members are arranged in the output carrier corresponding to the first portion and the second portion.

* * * * *